United States Patent [19]
Macdonald

[11] Patent Number: 5,581,217
[45] Date of Patent: Dec. 3, 1996

[54] MICROWAVE SHIELDING STRUCTURES COMPRISING PARALLEL-PLATE WAVEGUIDE

[75] Inventor: Perry A. Macdonald, Culver City, Calif.

[73] Assignee: Hughes Aircraft Company, Los Angeles, Calif.

[21] Appl. No.: 531,803

[22] Filed: Sep. 21, 1995

[51] Int. Cl.⁶ .................................. H01P 1/00; H04B 1/10
[52] U.S. Cl. ..................... 333/246; 361/818; 455/301; 333/239
[58] Field of Search ................. 333/12, 246; 334/85; 361/816, 818; 455/301

[56] References Cited

U.S. PATENT DOCUMENTS

| | | | |
|---|---|---|---|
| 4,648,128 | 3/1987 | Saka et al. | 334/85 X |
| 4,801,905 | 1/1989 | Becker | 333/246 X |
| 5,412,340 | 5/1995 | Tanikoshi | 361/816 X |

*Primary Examiner*—Paul Gensler
*Attorney, Agent, or Firm*—V. D. Duraiswamy; W. K. Denson-Low

[57] ABSTRACT

Shielding structures are provided for microwave circuits with substrate members and shield members which are formed from conventional substrates. The shield members are shaped and joined to the substrate members to form conductive compartments that substantially surround the microwave circuits and the compartments are closed with a conductive cover. The substrate members and shield members form parallel-plate waveguides which communicate between the compartments. The loss of these waveguides is increased with air-dielectric posts to obtain greater isolation between compartments.

6 Claims, 5 Drawing Sheets

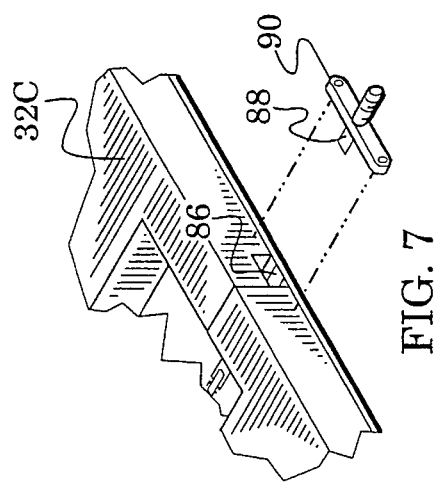
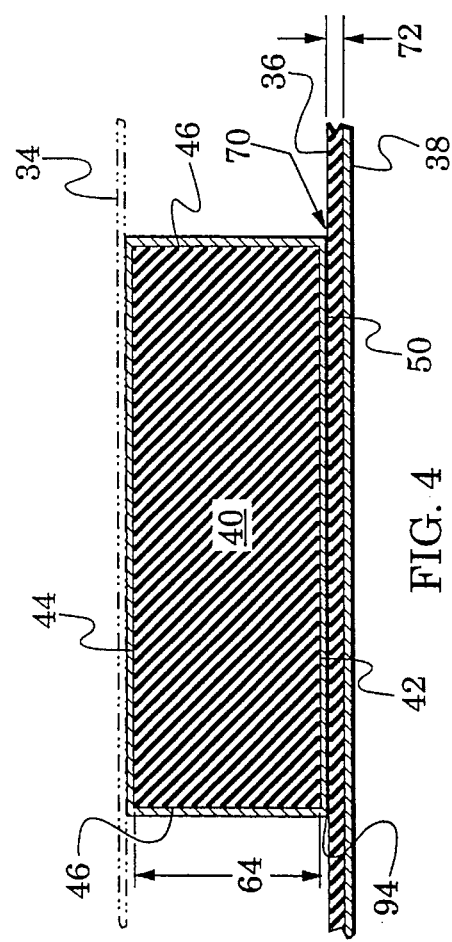
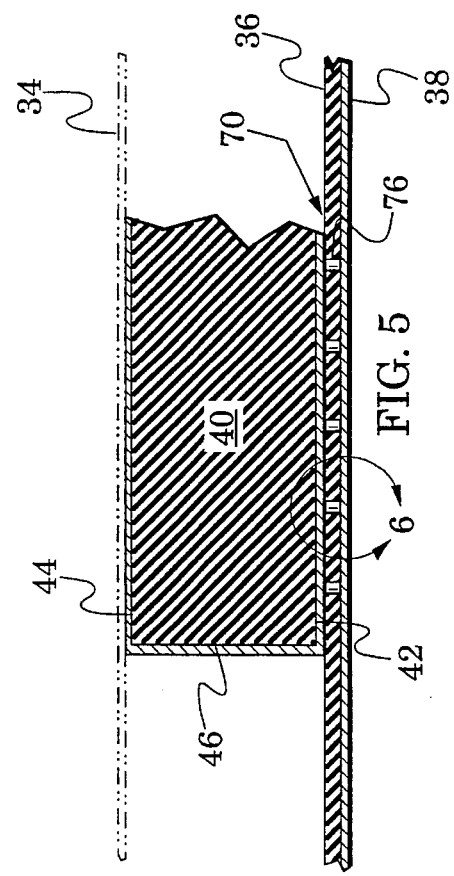

MICROWAVE SHIELDING STRUCTURES COMPRISING PARALLEL-PLATE WAVEGUIDE

BACKGROUND OF THE INVENTION

1. Field of the Invention

The present invention relates generally to shielding structures for microwave circuits.

2. Description of the Related Art

Successful operation of microwave circuits is impossible unless significant isolation is provided to reduce interactions between sensitive circuit portions. Although electromagnetic shielding requires care at any circuit frequency, it generally becomes more difficult as the frequency of interest moves into the upper microwave region, e.g., past 10 GHz. In microwave circuits that are intended for high-volume production, the shielding structures should also be designed for manufacturability and low cost, i.e., they should be simple to form and assemble. Because space is often limited in microwave systems, the shielding structures should be compact and, preferably, provide structural rigidity to the microwave circuits which they shield.

A current shielding method places each sensitive circuit in its own metal enclosure and connects the enclosures with transmission lines, e.g., coaxial lines and waveguides. Although this method can achieve a high level of circuit isolation, its use is generally restricted to prototype and low-volume manufacturing because of the time-consuming fabrication details that it requires, e.g., machining of metal enclosures and covers to reduce minute gaps between them. In addition, the enclosures and their connecting transmission lines add significant volume to the shielded circuits.

In another current shielding technique, metal rings are arranged to surround each sensitive circuit. The rings extend between floor and ceiling of an enclosure. Signals are coupled between circuits with circuit-type transmission lines, e.g., microstrip and stripline, which are passed through small apertures in the rings. Although this shielding structure is generally less costly and more space efficient than separate circuit enclosures, the fabrication and installation of the metal rings is generally not compatible with high-volume production.

SUMMARY OF THE INVENTION

The present invention is directed to microwave shielding structures which provide significant isolation for reduction of microwave circuit interactions and which lend themselves to low-cost, high-volume production because they are simple to fabricate and install.

These goals are achieved with substrate members and shield members which can be formed from conventional substrate materials. The substrate member has a dielectric layer for carrying a microwave circuit and a conductive layer which adjoins the dielectric layer. The shield members each have a core which is configured with an upper side, a lower side spaced from the upper side and a wall which connects the upper and lower sides and they are positioned with the core's lower side proximate the dielectric layer.

A conductive skin has a first portion which at least partially covers the core walls and a second portion which is positioned between the core's lower side and the dielectric member. A conductive cover is preferably carried over the core's upper side. The cores are shaped to cooperatively form, with the first skin portion, the conductive layer, and the conductive cover, a compartment which substantially surrounds the microwave circuit.

The second skin portion and the conductive layer forms a parallel-plate waveguide which communicates with the compartment. The dielectric layer is configured to define one or more passages which connect the second skin portion and the conductive layer. The passages form air-dielectric posts across the parallel-plate waveguide which substantially increases the waveguide's signal insertion loss and, therefore, the isolation of the compartment.

In an embodiment, the dielectric layer is formed of polytetrafluoroethylene-based laminate and the cores are formed of polyimide.

The novel features of the invention are set forth with particularity in the appended claims. The invention will be best understood from the following description when read in conjunction with the accompanying drawings.

BRIEF DESCRIPTION OF THE DRAWINGS

FIG. 4 is a view along the plane 4—4 of FIG. 1;

FIG. 5 is a view along the plane 5—5 of FIG. 1;

FIG. 7 is an isometric view of another embodiment of the shielding structure within the curved line 7 of FIG. 1.

DESCRIPTION OF THE PREFERRED EMBODIMENTS

Figure 1:
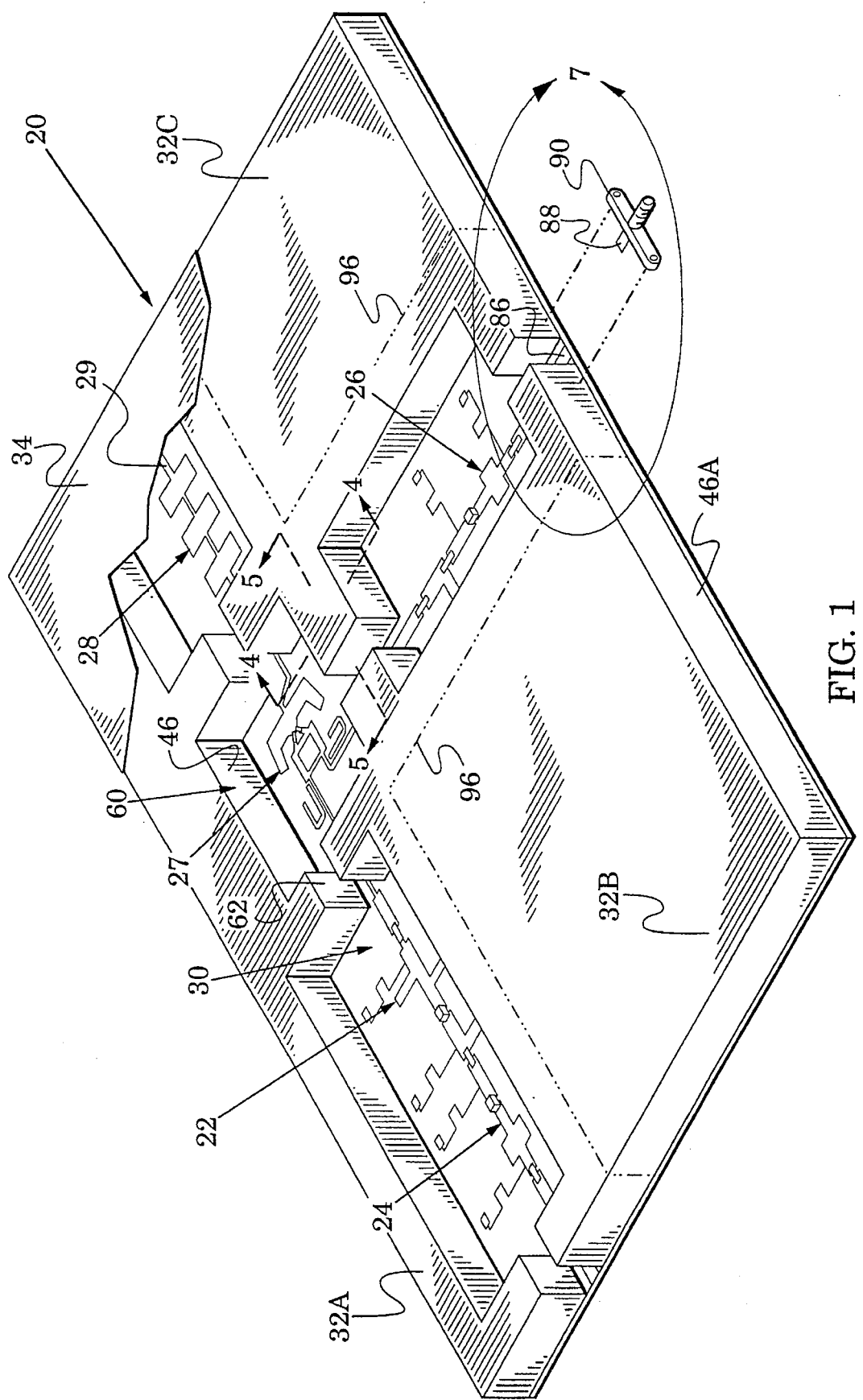
FIG. 1 is an isometric view of a microwave shielding structure in accordance with the present invention.

FIG. 1 illustrates a microwave shielding structure 20 in accordance with the present invention. For illustrative purposes, the shielding structure 20 is arranged to reduce microwave signal interaction between portions of an exemplary microwave circuit in the form of a down-conversion system 22. A description of the shielding structure 20 is facilitated by preceding it with the following description of the down-conversion system 22.

The elements of the system 22 include a two-stage radio-frequency (rf) amplifier 24, a single-stage local oscillator (lo) amplifier 26, an image-rejection, balanced mixer 27 and a low-pass filter 28. In operation of the exemplary microwave circuit 22, an rf signal from the rf amplifier 24 and an lo signal from the lo amplifier 26 are mixed in the image-rejection mixer 27 to produce a signal which is the difference between the rf signal and the lo signal. The difference signal is passed through the low-pass filter 28 for further processing in other circuits.

The image-rejection mixer 27 is configured to accentuate the difference signal and to attenuate a sum signal which is the sum of the rf signal and the lo signal, i.e., the mixer 27 will produce a sum signal with an amplitude that is reduced from that of the difference signal. The mixer 27 will also produce reduced levels of other mixer signals which are the sums and differences of harmonics of the rf and lo signals.

The low-pass filter 28 is designed to pass the desired difference signal and further reduce the amplitude of all the unwanted products.

In order to enhance the reduction of these unwanted product signals, each element of the down-conversion system 22 should be isolated from the other elements. For example, the amplitudes of the unwanted product signals which leave the low-pass filter 28 will be increased if there is a signal-leakage path which connects the image-rejection mixer 278 and the output 29 of the low-pass filter 28.

To achieve the goal of isolating the elements of the system 22, the microwave shielding structure 20 of FIG. 1 includes a substrate member 30 (also shown in FIG. 2), a plurality of shield members 32A–32C (also shown in FIG. 3) and a cover 34 which is formed of a conductive material, e.g., copper. As especially shown in FIG. 2, the substrate member 30 has a dielectric layer 36 for carrying the down-conversion system 22, and a conductive layer 38, e.g., a copper backing, which adjoins the dielectric layer 36.

FIG. 4 illustrates a cross-section of the shield member 32C which is a typical cross-section for all of the shield members 32A–32C. As especially shown in this figure, the shape of the member 32C is set by a core 40. The core 40 has a lower side 42 and an upper side 44 which is spaced from the lower side. The lower and upper sides 42 and 44 are connected by a circumferential wall 46 which is substantially orthogonal with the lower and upper sides. The sides 42 and 44 and the wall 46 are covered by a skin 50 of conductive material, e.g., copper. The core 40 is principally intended to form the desired shape of the shield members 32A–32C. Accordingly, its microwave properties are relatively unimportant and it can be formed of any rigid material. Preferably, the rigid material is easily shaped, lightweight and low-cost. In addition, it should not deform when subjected to the temperatures of typical microwave system environments. Many conventional dielectrics have these properties and would thus form suitable cores. In particular, many conventional polymers, e.g., polyemide, are suitable choices.

Figure 2:
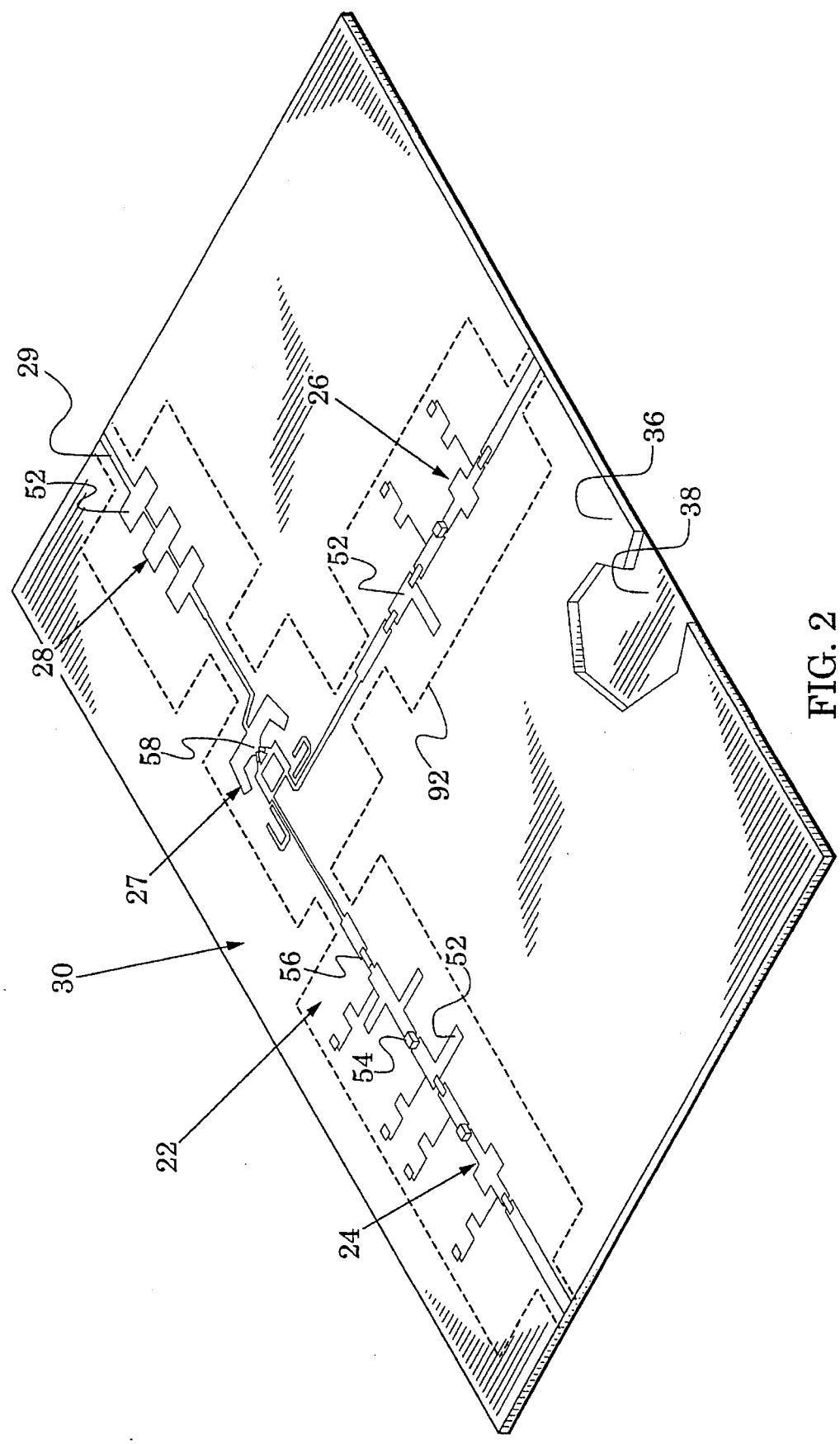
FIG. 2 is an isometric view of a substrate member in the shielding structure of FIG. 1.

The substrate member 30 has a dielectric whose relative permittivity $\epsilon_{r2}$ and loss tangent $\delta_2$ makes it suitable for use in microwave circuits. An exemplary microwave dielectric is a polytetrafluoroethylene-based laminate (e,g.,as manufactured under the trademark RT/duroid 5880) which has a $\epsilon_{r2}$ ~2.2 and a $\delta_2$ 18 1–15×10$^{-4}$ at 10 GHz. Such substrates are conventionally coated on both sides with copper. FIG. 2 illustrates that the copper on the upper surface of the dielectric (opposite surface from the backing layer 38 has been partially removed to define the distributed, microstrip signal patterns 52 of the rf amplifier 24, the lo amplifier 26, the image-rejection mixer 27 and the low-pass filter 28. These circuit elements of the down-conversion system 22 are then completed by adding discrete parts to the distributed signal patterns 52, e.g., transistors 54, coupling capacitors 56 and diodes 58.

Figure 3:
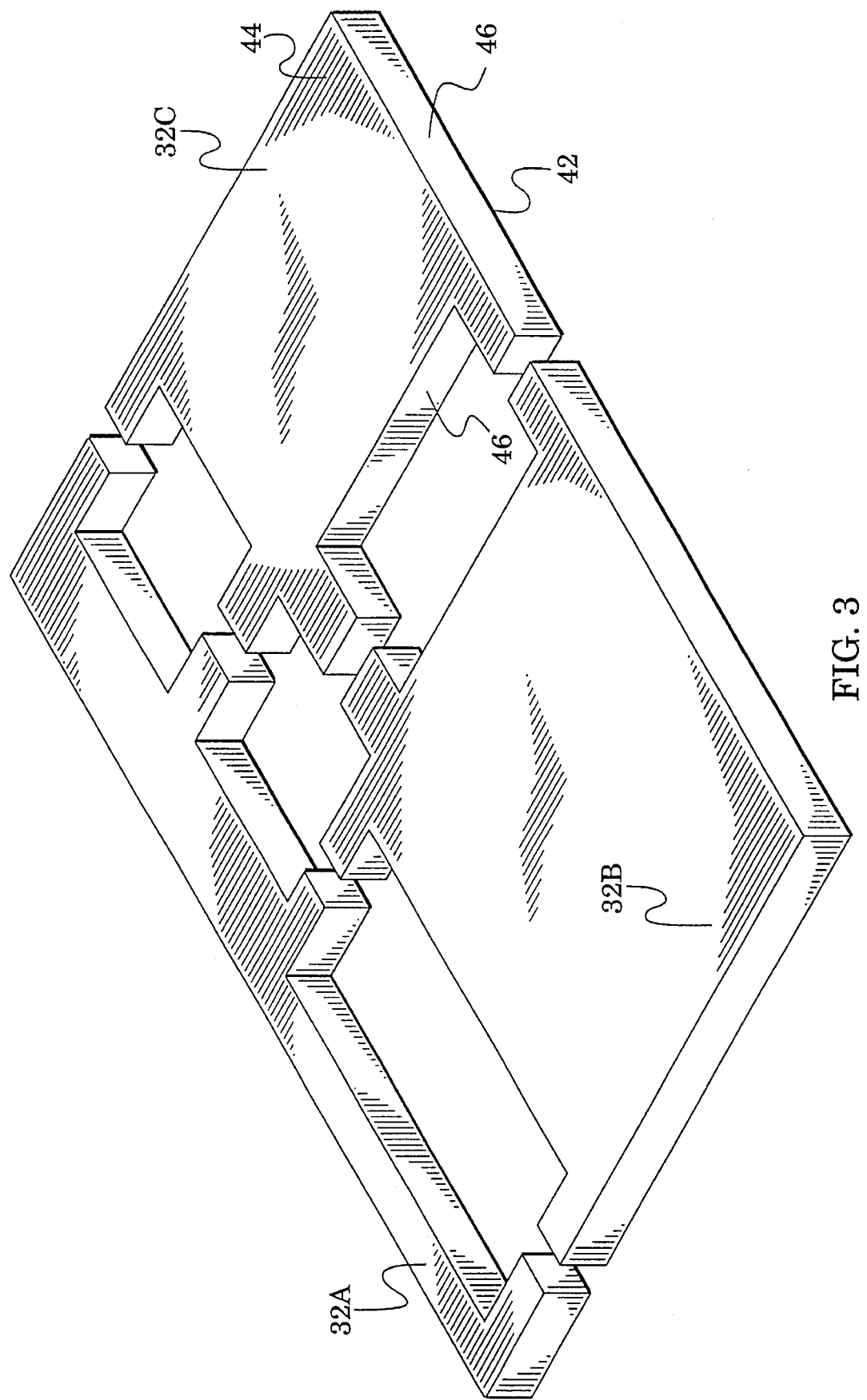
FIG. 3 is an isometric view of shield members in the shielding structure of FIG. 1.

When the shield members 32A–32C of FIG. 3, and the cover 34 are positioned on the substrate member 30 as shown in FIG. 1, each element of the down-conversion system 20 is substantially contained within a conductive compartment. For example, the conductive layer 38 and the conductive cover 34 are respectively below and above the image-rejection mixer 27 and the shield members 32A–32C are configured so that portions of their walls 46 substantially surround the image-rejection mixer 27. Thus, the image-rejection mixer 27 is substantially contained within a conductive compartment 60. This compartment is only broken by small gaps 62 which are arranged between the walls 46 for the passage of microstrip signal patterns which connect the image-rejection mixer 27 with the other circuit elements of the system 22.

Because the thickness of the dielectric layer 36 is relatively small, the distance between the conductive layer 38 and the conductive cover 34 is essentially set by the spacing 64 (shown in FIG. 4) between the lower side 42 and the upper side 44 of the core 40. This spacing 64 is selected in accordance with the design of the distributed microstrip signal patterns 52. For example, microstrip distributed design typically includes assumptions of distances from conductive surfaces so that the effect of these surfaces upon the magnetic and electric flinging fields of the distributed signal patterns can be predicted.

In addition to substantially surrounding each circuit element, the shield members 32A–32C each form parallel-plate waveguides with the substrate member 30. These parallel-plate waveguides extend away from the perimeters of the circuit elements of the down-conversion system 22. For example, FIG. 4 illustrates that the conductive skin 50 on the lower side 42 of shield member 32C and the conductive layer 38 of the substrate member 30 form a parallel-plate waveguide 70, which connects the compartment 60 of the image-rejection mixer 27 with a similar conductive compartment which substantially contains the lo amplifier 26, i.e., the parallel-plate waveguide 70 communicates with each compartment. The parallel-plate waveguide 70 has a height 72 which is set by the thickness of the dielectric layer 36. The thickness of the dielectric layer 36 is selected in accordance with the design of the distributed microstrip signal patterns 52.

If a circuit element, e.g., the rf amplifier 24, has an operational wavelength $\lambda$, its distributed microstrip signal patterns 52 have an operational guide wavelength $\lambda_g$ which $=\lambda/(\epsilon_{r2})^{1/2}$. For most distributed microstrip designs, the spacing between the microstrip signal patterns 52 and their ground plane, which is the conductive layer 38, is $<<\lambda_g/2$, e.g., $~\lambda_g/20$. This spacing sets the height 72 of the parallel-plate waveguide 70.

Microwave energy propagates in parallel-plate waveguides in the transverse electromagnetic wave mode (TEM) which does not have a cutoff frequency as do transverse electric wave modes (TE) and transverse magnetic wave modes (TM). Thus, a portion of the microwave energy in the image-rejection mixer 27 can couple through the parallel-plate waveguide 70 to the lo amplifier 26. This coupling will have a loss that is proportional to the propagation constants of the electromagnetic propagation mode in the shielded compartments, e.g., the compartment 60, and the TEM propagation mode in the parallel-plate waveguide 70. For example, if the propagation mode in the compartments is the $TM_0$ mode, this ratio is $~(\epsilon_{r2})^{1/2}$. Although this isolation loss would typically be >10 db, the operation of microwave systems such as the down-conversion mixer 22 of FIG. 1 is enhanced if the isolation loss is increased from this value.

Loss through a parallel-plate waveguide is conventionally increased by positioning conductive elements so that they shunt the plates of the waveguide. For example, plated vias are often formed by drilling passages in the dielectric between the parallel plates and then plating the walls of the passages with conductive materials. A row of such plated vias is known to greatly increase the isolation loss through parallel-plate waveguides. However, several operations, e.g., drilling, cleaning, plating and inspection, are required to fabricate plated vias. In addition, temperature-induced expansions and contractions often cause failures in plated vias.

In the present invention, the insertion loss of parallel-plate waveguides is increased with air-dielectric posts that are arranged in shunt across the waveguide plates. A row of air-dielectric posts 76 are shown in FIG. 5 to be spaced across the parallel-plate waveguide 70. One of the posts 76 is also shown in the enlarged view of FIG. 6A. The posts 76 are formed by simply drilling passages through the dielectric member 36. To facilitate high-volume production, the air-dielectric posts are preferably formed by high-speed operations such as stacking hundreds of parts and forming the passages simultaneously in all parts with computer-numerically-controlled (CNC) drilling machines. Accordingly, FIG. 6B illustrates that the air-dielectric posts 76 can also be formed by first, drilling passages completely through the dielectric layer 36 and the conductive layer 38 and secondly, bonding another conductive layer in the form of a sheet 78 to the layer 38. That is, the CNC operation necessarily forms an opening in the conductive layer 38 which communicates with the passage in the dielectric layer 36 but the opening is bridged by the conductive sheet 78.

Some microwave designs call for a plurality of stacked, substrate members. For example, FIG. 6C illustrates a second substrate member 80 that is used to form a patch antenna with a conductive patch 82. This patch 82 would typically be excited by a coupling aperture (not shown) in the two substrate members 30 and 80. As shown in FIG. 6C, such a second substrate member can also be used to form the bottom conductive sheet of the air-dielectric post 76.

Figure 6A:
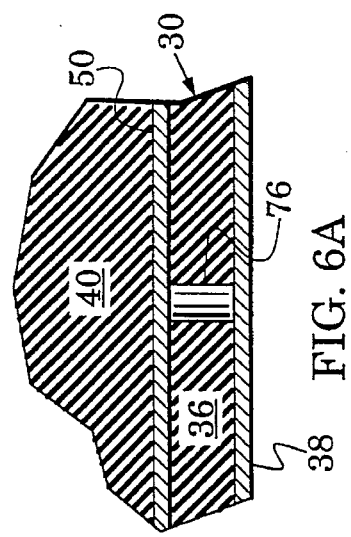
FIG. 6A is an enlarged view of a dielectric post within the curved line 6 of FIG. 5.
Figure 6B:
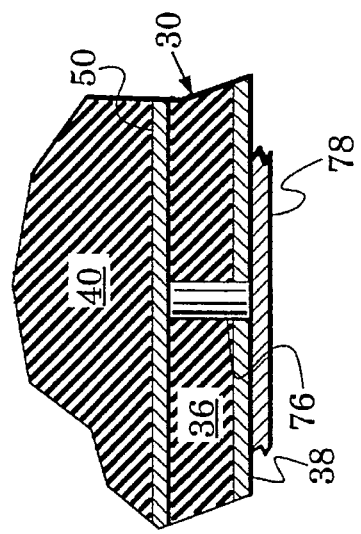
FIG. 6B is a view similar to FIG. 6A illustrating another dielectric post embodiment.
Figure 6C:
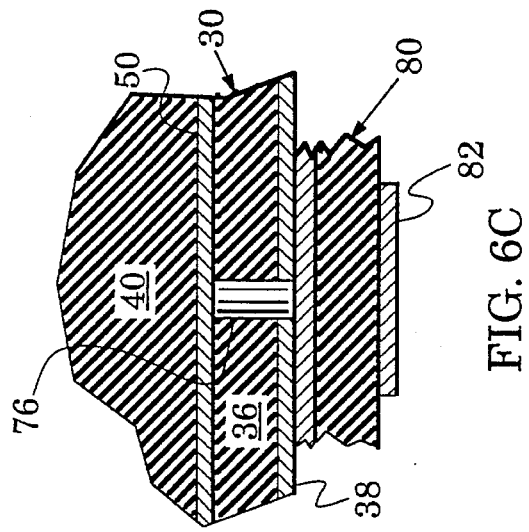
FIG. 6C is a view similar to FIG. 6A illustrating another dielectric post embodiment.

The equivalent circuit of the dielectric post 76 in FIG. 6A is capacitive. This is demonstrated by using Ampere's Law to relate the magnetic and electric field in the region of the post 76. The relationship is given by $$\nabla \times \overline{H} = j\omega\epsilon_1 \overline{E},$$

which is equivalent to $$\nabla \times \overline{H} = j\omega\epsilon_0 \overline{E} - j\omega(\epsilon_1 - \epsilon_0). \quad (1)$$

If the second term in equation (1) is considered to be a volume current $J_d$, then the waveguide impedance at the dielectric post 76 becomes $$Z = \frac{V}{J_d} \propto \frac{1}{j\omega(\epsilon_0 - \epsilon_1)}. \quad (2)$$

Because the relative permittivity $\epsilon_o$ of air is less than the relative permittivity $\epsilon_{r2}$ of the dielectric layer 36, the sign of the denominator of equation (2) is negative, which indicates that the impedance Z is indeed capacitive. Thus, a row of air-dielectric post 76 can be placed across the parallel-plate waveguide 70 in FIG. 5 as shunt circuit elements which increase the isolation loss between the compartment 60 of the image-rejection mixer 27 and the compartment of the lo amplifier 26. In contrast with plated vias, the air-dielectric posts 76 can be easily created in hundreds of circuits simultaneously with one operation of CNC drilling machines.

In FIG. 1, the distributed microstrip signal signal patterns 52 are carried to the edges of the substrate member 36 from where they can be coupled to other microstrip signal patterns. Alternatively, the signal patterns can be coupled to microwave connectors. For example, the pattern end 86 can be joined to the fiat launcher 88 of a coaxial microwave connector 90. As shown in FIG. 7, the shield member 32C can be shaped to more completely surround the pattern end 86 to enhance the isolation of the compartment which surrounds the lo amplifier 26.

The broken lines 92 in FIG. 2 indicate the portions of contact between the substrate member 30 and the shield members 32A–32C of FIG. 3. If desired, copper coating can retained in these areas of the upper surface of the substrate member, where it will contact the conductive skin of the shield members. As indicated in FIG. 4, the shield members 32A–32C can be bonded to the substrate members 30 with various well known adhesives 94, e.g., thermosetting polyester resins. In FIG. 1, the areas of the substrate member 30 and the shield members 32A–32C which are indicated by the broken lines 96 are can be removed, if desired, to reduce the size of the shielding structure 20. If desired, portions of the shield members 32A–32C that do not participate in microwave shielding, can be formed without the conductive skin 50, e.g., the walls 46A which are directed outward from the down-conversion system 22 in FIG. 1. It is only necessary that the conductive skin 50 has a first portion which at least partially covers the walls 46 and a second portion which is positioned between the lower side 42 and the dielectric member 36 to form a parallel-plate waveguide 70 with the conductive layer 38. That is, the lower side 42 is positioned proximate the conductive layer 38 and they are separated by the second portion of the skin 50.

The shielding structures taught by the present invention are especially suited for providing microwave circuit isolation and for reducing circuit interactions in low-cost, high-volume production environments. The substrate members and shield members which form shielding compartments in these structures are easily fabricated from conventional substrates. The shield members add significant stiffening to the shielding structures. The isolation loss in parallel-plate waveguides between the shielding compartments is easily increased with air-dielectic posts which can be fabricated with high-speed equipment, e.g., CNC drilling machines.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

I claim:

1. A shielding structure for isolating a microstrip circuit, comprising:

a substrate member having a dielectric layer and a conductive layer, said dielectric layer having a first side for carrying said microstrip circuit and a second side which adjoins said conductive layer;

at least one shield member having a dielectric core and a conductive skin over said core, wherein said shield member is positioned to abut said first side of said dielectric layer and to be proximate to said microstrip circuit;

a plurality of passages formed by said dielectric layer with each of said passages having first and second ends and positioned so that said shield member abuts and extends across one of its ends and said conductive layer abuts and extends across the other of its ends; and a conductive cover abutting said shield member with said shield member between said conductive cover and said substrate member;

said conductive skin, said dielectric layer and said conductive layer forming a parallel-plate waveguide which communicates with said microstrip circuit and said passages forming air-dielectric posts across said parallel-plate waveguide to increase the insertion loss of said parallel-plate waveguide.

2. The shielding structure of claim 1, wherein said dielectric core comprises polyimide.

3. A shielding structure for isolating a microwave circuit, comprising:

a substrate member having a dielectric layer and a conductive layer, said dielectric layer having a first side for carrying said microwave circuit and a second side which adjoins said conductive layer;

at least one core member, which is shaped to have an upper side, a lower side spaced from said upper side and a circumferential wall which connects said upper and lower sides; and first and second conductive skins;

wherein;

said core member is positioned with said lower side proximate said dielectric layer and a portion of said wall proximate said microwave circuit;

said first conductive skin is carried by said wall portion;

said second conductive skin is positioned between said lower side and said dielectric layer;

said dielectric layer is configured to form at least one passage which connects said second conductive skin and said conductive layer; and said conductive layer is configured to define an opening which is positioned to communicate with said at least one passage and further including a conductive sheet positioned over said opening and connected to said conductive layer;

said second conductive skin and said conductive layer forming a parallel-plate waveguide and said at least one passage forming an air-dielectric post across said parallel-plate waveguide.

4. A shielding structure for isolating a microstrip circuit, comprising:

a substrate member having a dielectric layer and a conductive layer, said dielectric layer having a first side for carrying said microstrip circuit and a second side which adjoins said conductive layer;

a plurality of shield members, each having a dielectric core and a conductive skin over said core, wherein said shield members are positioned to abut said first side of said dielectric layer and to be proximate to said microstrip circuit;

a plurality of passages formed by said dielectric layer with each of said passages having first and second ends and positioned so that a respective one of said shield members abuts and extends across one of its ends and said conductive layer abuts and extends across the other of its ends; and a conductive cover abutting said shield members with said shield members between said conductive cover and said substrate member;

wherein said shield members are shaped to cooperatively form, with said substrate member and said conductive cover, a compartment which substantially surrounds said microstrip circuit;

the conductive skins of said shield members forming parallel-plate waveguides with said dielectric layer and said conductive layer, said parallel-plate waveguides communicating with said compartment and said passages forming air-dielectric posts across said parallel-plate waveguides to increase the insertion loss of said parallel-plate waveguide.

5. The shielding structure of claim 4, wherein said dielectric core comprises polyimide.

6. A shielding structure for isolating a microwave circuit, comprising:

a substrate member having a dielectric layer and a conductive layer, said dielectric layer having a first side for carrying said microwave circuit and a second side which adjoins said conductive layer;

at least one core member having an upper side, a lower side spaced from said upper side and a circumferential wall;

a conductive cover;

a first conductive skin; and a second conductive skin;

wherein:

said core member is positioned with said lower side proximate said dielectric layer;

said first conductive skin is carried over at least a portion of said wall;

said conductive cover is positioned over said upper side;

said at least one core member is shaped to cooperatively form, with said first conductive skin, said conductive layer and said conductive cover, a compartment which substantially surrounds said microwave circuit;

said second conductive skin is positioned between said lower side and said dielectric layer, said second conductive skin and said conductive layer forming a parallel-plate waveguide which communicates with said compartment;

said dielectric layer is configured to form at least one passage which connects said second conductive skin and said conductive layer, said passage forming an air-dielectric post across said parallel-plate waveguide; and said conductive layer is configured to define an opening which is positioned to communicate with said at least one passage and further including a conductive sheet positioned over said opening and connected to said conductive layer.

* * * * *